United States Patent
Chien et al.

(10) Patent No.: US 9,331,256 B2
(45) Date of Patent: May 3, 2016

(54) SEMICONDUCTOR STRUCTURE WITH SENSOR CHIP AND LANDING PADS

(71) Applicant: XINTEC INC., Zhongli, Taoyuan County (TW)

(72) Inventors: Wei-Ming Chien, Yangmei (TW);
Chia-Sheng Lin, Zhongli (TW);
Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/464,570

(22) Filed: Aug. 20, 2014

(65) Prior Publication Data

US 2015/0054002 A1    Feb. 26, 2015

Related U.S. Application Data

(60) Provisional application No. 61/868,324, filed on Aug. 21, 2013.

(51) Int. Cl.
*H01L 21/76* (2006.01)
*H01L 27/146* (2006.01)
*H01L 33/62* (2010.01)
*H01L 21/768* (2006.01)

(52) U.S. Cl.
CPC .......... *H01L 33/62* (2013.01); *H01L 21/76898* (2013.01); *H01L 27/14601* (2013.01)

(58) Field of Classification Search
CPC ............ H01L 27/146; H01L 27/14601; H01L 27/276; H01L 33/62
See application file for complete search history.

(56) References Cited

U.S. PATENT DOCUMENTS

| | | | | |
|---|---|---|---|---|
| 8,017,940 B2* | 9/2011 | Nakatani | ............... | H01L 27/283 257/40 |
| 8,378,361 B2* | 2/2013 | Takeuchi | ............ | H01L 27/3246 257/214 |
| 8,563,994 B2* | 10/2013 | Harada | ............... | H01L 51/5048 257/79 |
| 9,153,791 B2* | 10/2015 | Akamatsu | ........... | H01L 51/5056 |
| 2007/0241665 A1* | 10/2007 | Sakanoue | ........... | H01L 51/5092 313/503 |
| 2009/0042355 A1 | 2/2009 | Naito | | |
| 2010/0102460 A1 | 4/2010 | Tomita et al. | | |
| 2010/0181559 A1* | 7/2010 | Nakatani | ............. | H01L 27/3246 257/40 |
| 2013/0292825 A1* | 11/2013 | Huang | .............. | H01L 23/49811 257/737 |

FOREIGN PATENT DOCUMENTS

| | | |
|---|---|---|
| JP | 63-269549 | 11/1988 |
| JP | 04-023455 | 1/1992 |
| JP | 11-354560 | 12/1999 |

* cited by examiner

*Primary Examiner* — Thanh V Pham
(74) *Attorney, Agent, or Firm* — Liu & Liu

(57) ABSTRACT

A manufacturing method of a semiconductor structure includes the following steps. A patterned photoresist layer is formed on a wafer of the wafer structure. The wafer is etched, such that channels are formed in the wafer, and a protection layer of the wafer structure is exposed through the channels. The protection layer is etched, such that openings aligned with the channels are formed in the protection layer. Landing pads in the protection layer are respectively exposed through the openings and the channels, and the caliber of each of the openings is gradually increased toward the corresponding channel. Side surfaces of the wafer surrounding the channels are etched, such that the channels are expanded to respectively form hollow regions. The caliber of the hollow region is gradually decreased toward the opening, and the caliber of the opening is smaller than that of the hollow region.

13 Claims, 16 Drawing Sheets

SEMICONDUCTOR STRUCTURE WITH SENSOR CHIP AND LANDING PADS

RELATED APPLICATIONS

This application claims priority to U.S. provisional Application Ser. No. 61/868,324, filed Aug. 21, 2013, which is herein incorporated by reference.

BACKGROUND

1. Field of Invention

The present invention relates to a semiconductor structure and a manufacturing method thereof.

2. Description of Related Art

A conventional semiconductor structure may include a chip, landing pads, a dielectric layer (e.g., SiO2) and a redistribution layer (RDL). In general, when the semiconductor structure is manufactured, the dielectric layer is used to cover a wafer which is not cut yet to form plural chips for protecting the electronic elements on the wafer. The electronic elements may be image sensors.

Thereafter, a patterned photoresist layer may be formed on the surface of the wafer facing away from the dielectric layer, in such a way that the surface of the wafer above the landing pads that is in the dielectric layer is not covered by the photoresist layer. As a result, the wafer and the dielectric layer that are above the landing pads may be removed by an etching process, such that vertical channels are formed in the wafer and the dielectric layer, and the landing pads may be exposed through the channels. Subsequently, the redistribution layer may be formed on sidewalls of the wafer and the dielectric layer surrounding the channels and the landing pads, such that the redistribution layer can be in electrical contact with the landing pads.

However, the surface of the wafer facing away from the dielectric layer is substantially perpendicular to the sidewalls of the wafer surrounding the channels, and the sidewalls of the dielectric layer surrounding the channels are perpendicular to the landing pads. As a result, the redistribution layer is apt to be broken at connection positions between the surface of the wafer facing away from the dielectric layer and the sidewalls of the wafer surrounding the channels, and connection positions between the sidewalls of the dielectric layer surrounding the channels and the landing pads.

SUMMARY

An aspect of the present invention is to provide a semiconductor structure.

According to an embodiment of the present invention, a semiconductor structure includes a chip, a protection layer, a landing pad, an isolation layer, and a conductive layer. The chip has an image sensor and a hollow region. The protection layer is located on the surface of the chip and covers the image sensor. The protection layer has an opening aligned with and communicated with the hollow region. The caliber of the opening is smaller than the caliber of the hollow region. The caliber of the opening is gradually increased in a direction toward the hollow region, and the caliber of the hollow region is gradually decreased in a direction toward the opening, such that the first sidewall of the protection layer surrounding the opening and the second sidewall of the chip surrounding the hollow region are oblique surfaces. The landing pad is located in the protection layer and exposed through the opening. The isolation layer is located on the first and second sidewalls and the surface of the protection layer adjacent to the first and second sidewalls. The conductive layer is located on the isolation layer and covers the landing pad. The conductive layer is in electrical contact with the landing pad.

In one embodiment of the present invention, an included angle between the first sidewall and the landing pad and an included angle between the second sidewall and the protection layer are acute angles.

In one embodiment of the present invention, the semiconductor structure further includes a passivation layer. The passivation layer covers the conductive layer.

In one embodiment of the present invention, the semiconductor structure further includes a light transmissive element and a supporting layer. The supporting layer is between the light transmissive element and the protection layer. A space is formed among the light transmissive element, the supporting layer, and the protection layer.

In one embodiment of the present invention, the semiconductor structure further includes a color filter. The color filter is disposed on the surface of the protection layer facing away from the chip, and is located in the space. The color filter is aligned with the image sensor.

Another aspect of the present invention is to provide a manufacturing method of a semiconductor structure.

According to an embodiment of the present invention, a manufacturing method of a semiconductor structure includes the following steps. (a) A wafer structure is provided, and the wafer structure has a wafer and a protection layer covering the wafer. (b) A patterned photoresist layer is formed on the surface of the wafer facing away from the protection layer. (c) The wafer is etched to form a plurality of channels in the wafer, such that the protection layer is exposed through the channels. (d) The protection layer is etched to form a plurality of openings aligned with the channels, such that a plurality of landing pads in the protection layer are respectively exposed through the openings and the channels, and the caliber of each of the openings is gradually increased in a direction toward the corresponding channel. (e) A plurality of side surfaces of the wafer surrounding the channels are etched, such that the channels are expanded to respectively form a plurality of hollow regions. The caliber of each of the hollow regions is gradually decreased in a direction toward the corresponding opening, and the caliber of each of the openings is smaller than the caliber of the corresponding hollow region.

In one embodiment of the present invention, the manufacturing method of the semiconductor structure further includes: an isolation layer is formed on a plurality of first sidewalls of the protection layer surrounding the openings, a plurality of second sidewalls of the wafer surrounding the hollow regions, the landing pads, and surfaces of the protection layer adjacent to the first and second sidewalls. The isolation layer is patterned to remove the isolation layer located on the landing pads.

In one embodiment of the present invention, the manufacturing method of the semiconductor structure further includes: a conductive layer is formed on the isolation layer and the landing pads, and the conductive layer is in electrical contact with the landing pads.

In one embodiment of the present invention, the manufacturing method of the semiconductor structure further includes: a passivation layer is formed to cover the conductive layer.

In one embodiment of the present invention, the wafer structure has a light transmissive element and a supporting layer between the light transmissive element and the protection layer, and the manufacturing method of the semiconductor structure further includes: a die preparation process is used to dice the passivation layer, the wafer, the protection layer, the supporting layer, and the light transmissive element.

In the aforementioned embodiments of the present invention, after the channels are formed in the wafer, the protection layer is etched to form the openings aligned with the channels. Thereafter, the side surfaces of the wafer surrounding the channels are etched, such that the channels are expanded to respectively form the hollow regions. The aforesaid two etching processes can expose the landing pads through the openings of the protection layer and the hollow regions of the wafer. When the protection layer is etched, each of the openings of the protection layer is gradually increased in a direction toward the corresponding channel. When the side surfaces of the wafer is etched, the caliber of each of the hollow regions of the wafer is gradually decreased in a direction toward the corresponding opening of the protection layer, and the caliber of each of the openings is smaller than the caliber of the corresponding hollow region.

As a result, the conductive layer is prevented from being broken at connection positions between the surface of the wafer facing away from the protection layer and the sidewalls of the wafer surrounding the hollow regions, and connection positions between the sidewalls of the protection layer surrounding the openings and the landing pads.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
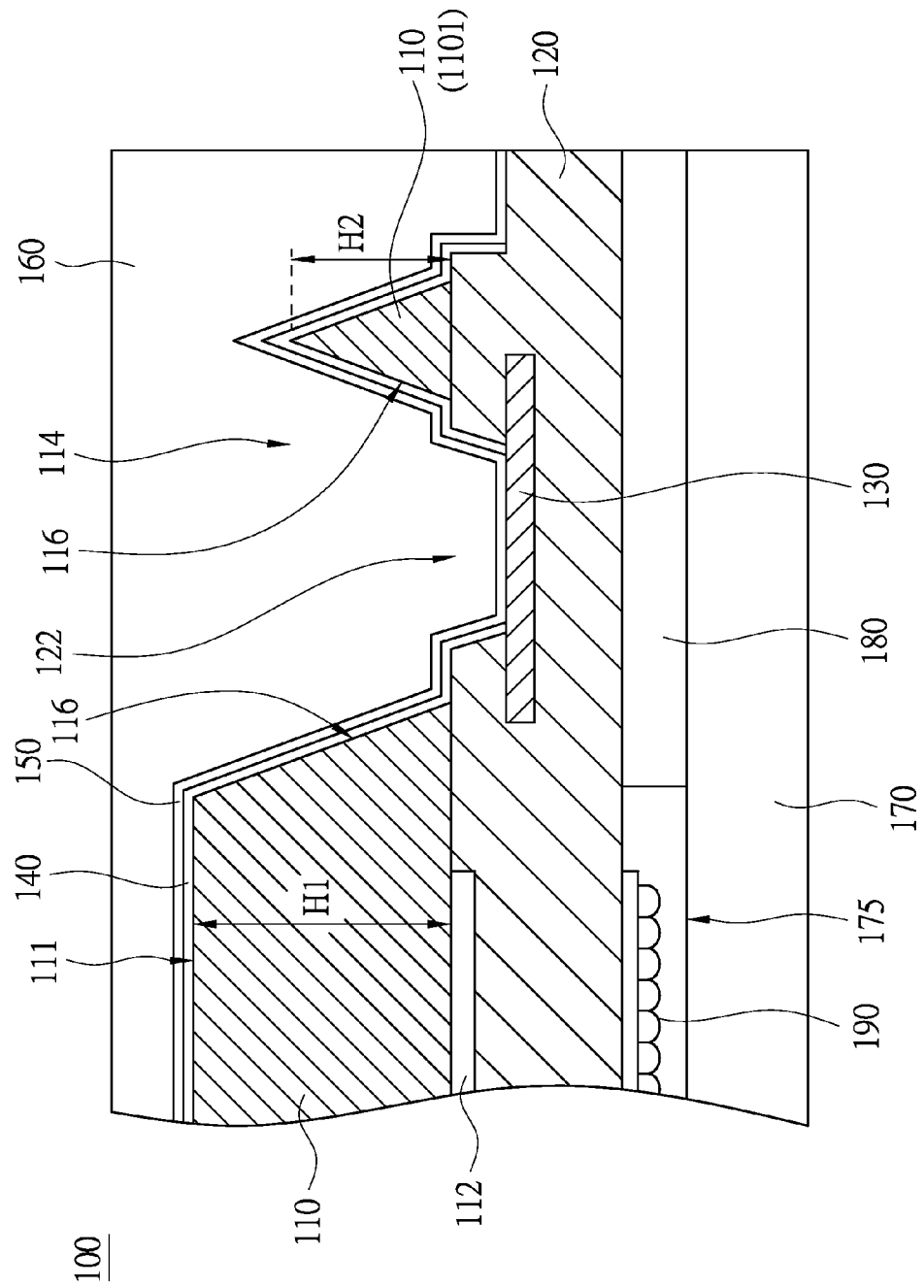
FIG. 1 is a cross-sectional view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
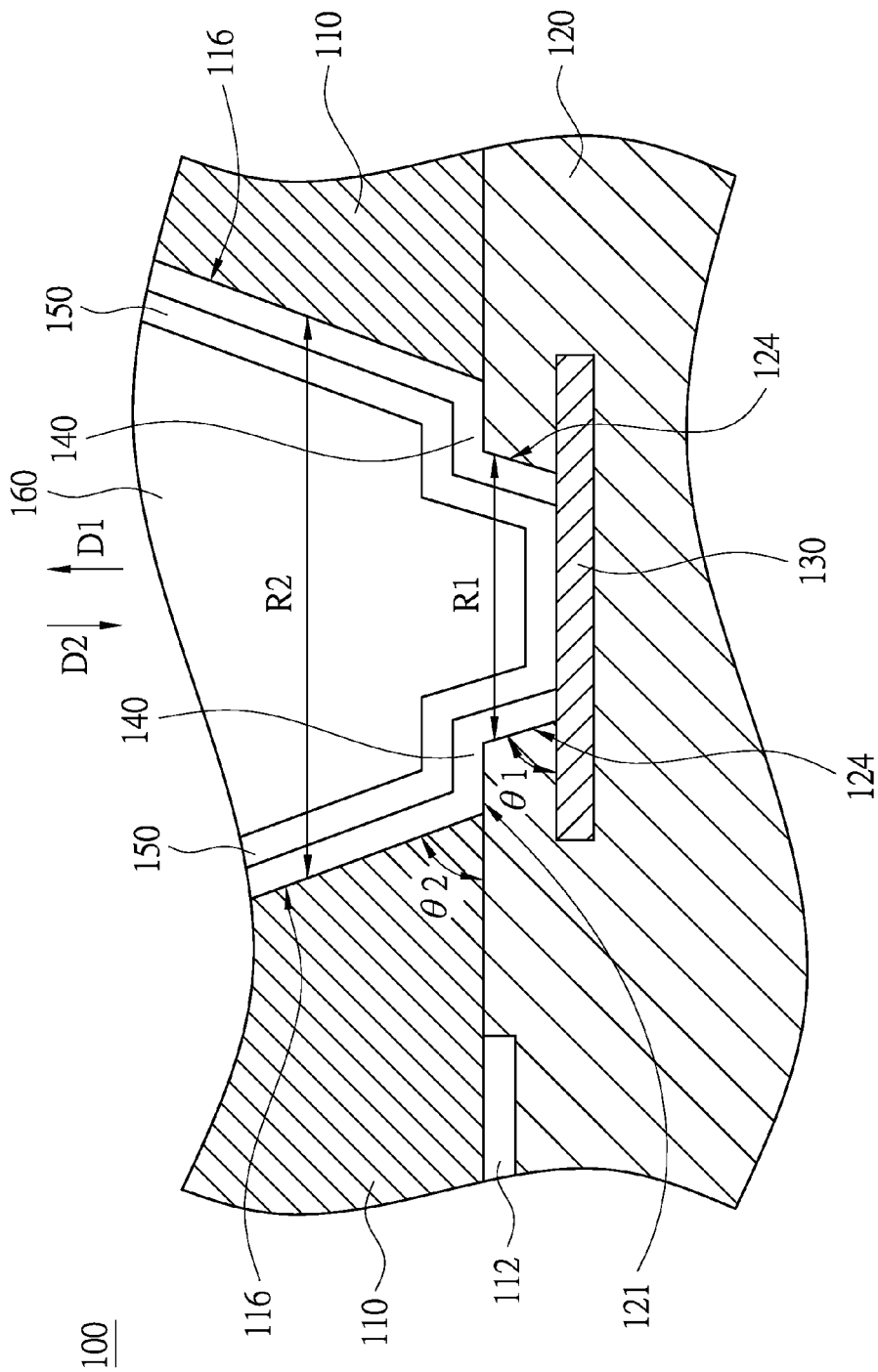
FIG. 2 is a partial enlarged view of the semiconductor structure shown in FIG. 1.

FIG. 1 is a cross-sectional view of a semiconductor structure 100 according to one embodiment of the present invention. FIG. 2 is a partial enlarged view of the semiconductor structure 100 shown in FIG. 1. As shown in FIG. 1 and FIG. 2, the semiconductor structure 100 includes a chip 110, a protection layer 120, a landing pad 130, an isolation layer 140, and a conductive layer 150. The chip 110 has an image sensor 112 and a hollow region 114. The protection layer 120 is located on the surface of the chip 110 and covers the image sensor 112 for protecting the image sensor 112. The protection layer 120 has an opening 122 aligned with and communicated with the hollow region 114 of the chip 110. Moreover, the caliber R1 of the opening 122 is smaller than the caliber R2 of the hollow region 114. The caliber R1 of the opening 122 is gradually increased in a direction D1 toward the hollow region 114, and the caliber R2 of the hollow region 114 is gradually decreased in a direction D2 toward the opening 122, such that the first sidewall 124 of the protection layer 120 surrounding the opening 122 and the second sidewall 116 of the chip 110 surrounding the hollow region 114 are oblique surfaces. As a result, an included angle θ1 between the first sidewall 124 and the landing pad 130 and an included angle θ2 between the second sidewall 116 and the protection layer 120 are acute angles.

The landing pad 130 is located in the protection layer 120 and exposed through the opening 122. The isolation layer 140 is located on the surface 111 of the chip 110, the first sidewall 124 of the protection layer 120, the second sidewall 116 of the chip 110, and the surface 121 of the protection layer 120 adjacent to the first and second sidewalls 124, 116. The conductive layer 150 is located on the isolation layer 140 and covers the landing pad 122 that is exposed through the opening 122, such that the conductive layer 150 may be in electrical contact with the landing pad 130.

By the design of the opening 122 of the protection layer 120 and the hollow region 114 of the chip 110, the first sidewall 124 of the protection layer 120 and the second sidewall 116 of the chip 110 are oblique surfaces. Therefore, the conductive layer 150 may be prevented being broken at connection positions between the surface 111 and the second sidewall 116 of the chip 110, and connection positions between the first sidewall 124 of the protection layer 120 and the landing pad 130.

In addition, the semiconductor structure 100 may further include a passivation layer 160, a light transmissive element 170, a supporting layer 180, and a color filter 190. The passivation layer 160 covers the conductive layer 150 to prevent moisture and dust from entering the semiconductor structure 100. The supporting layer 180 is between the light transmissive element 170 and the protection layer 120, such that a space 175 is formed among the light transmissive element 170, the supporting layer 180, and the protection layer 120. The color filter 190 is disposed on the surface of the protection layer 120 facing away from the chip 110, and is located in the space 175. The color filter 190 is aligned with the image sensor 112 of the chip 110. After a light enters the light transmissive element 170, the light may pass through the color filter 190 and is detected by the image sensor 112.

As shown in FIG. 1, the chip 110 has a protruding structure 1101 adjacent to the right side of the hollow region 114. The shape of the protruding structure 1101 is triangle, but the present invention is not limited in this regard. The thickness H1 of the chip 110 adjacent to the left side of the hollow region 114 is greater than the height H2 of the protruding structure 1101. That is to say, the second sidewall 116 of the chip 110 at the left side of the hollow region 114 is higher than the sidewall 116 of the chip 110 at the right side of the hollow region 114. In this embodiment, the passivation layer 160 completely covers the hollow region 114.

In this embodiment, the chip 110 may be an image sensing element, a microelectromechanical system (MEMS) component, a calculating processor, etc. The chip 110 may be made of a material that includes silicon. The chip 110 may be one of plural chips formed from a wafer after a die preparation process is performed with respect to the wafer. The protection layer 120 and the passivation layer 160 may be silicon oxide, such as $SiO_2$, but the present invention is not limited in this regard. The landing pad 130 and the conductive layer 150 may be made of a material including aluminum, copper, or other conductive metals. The light transmissive element 170 may be a glass plate, and the supporting layer 180 may be made of a material including epoxy. However, in another embodiment, the light transmissive element 170 and the supporting layer 180 may be made of other materials, and the present invention is not limited in this regard.

It is to be noted that the connection relationships of the elements described above will not be repeated in the following description, and aspects related to the manufacturing method of the semiconductor structure 100 will be described in the following description.

Figure 3:
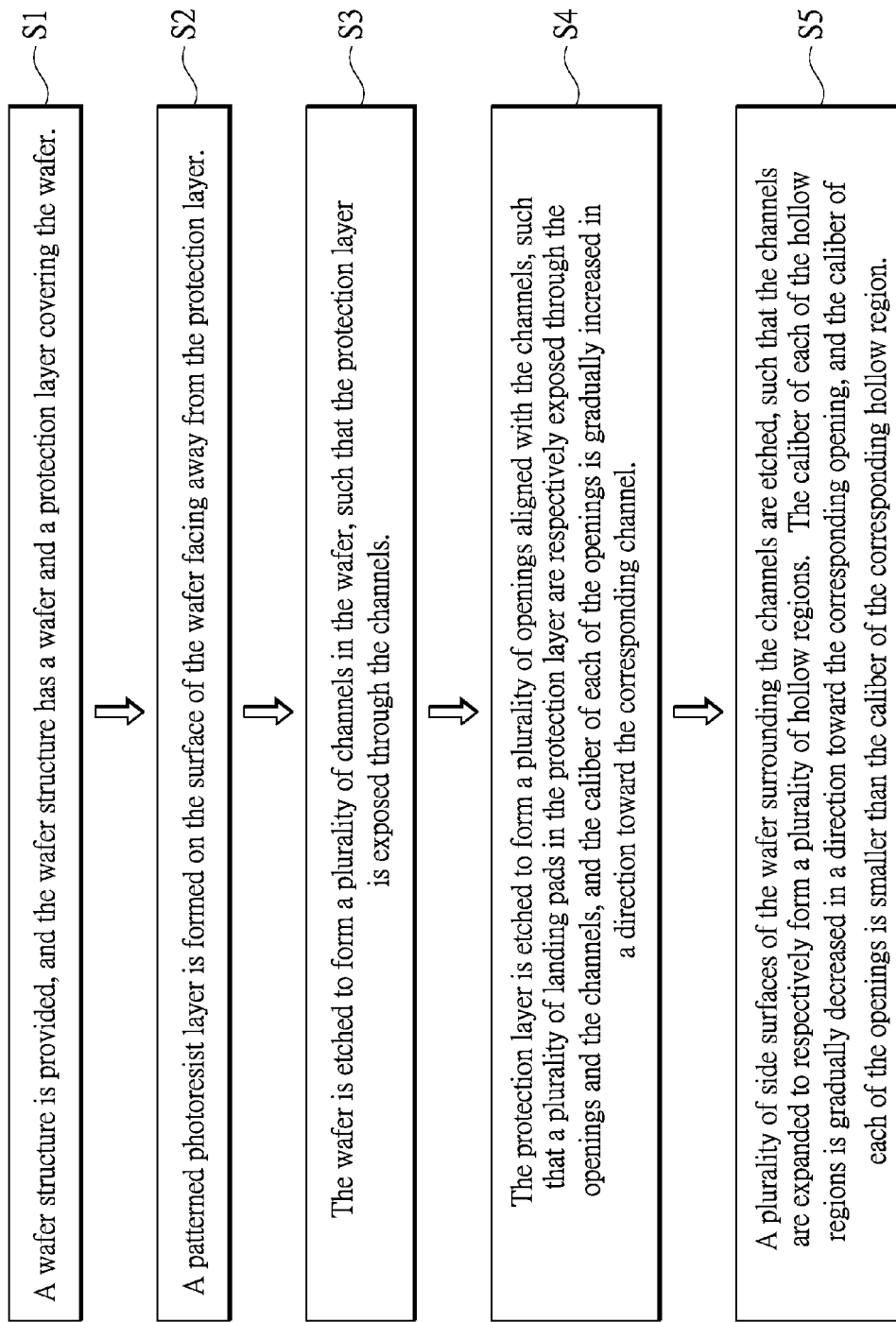
FIG. 3 is a flow chart of a manufacturing method of a semiconductor structure according to one embodiment of the present invention.

FIG. 3 is a flow chart of a manufacturing method of a semiconductor structure according to one embodiment of the present invention. In step S1, a wafer structure is provided, and the wafer structure has a wafer and a protection layer covering the wafer. Thereafter in step S2, a patterned photoresist layer is formed on the surface of the wafer facing away from the protection layer. Next in step S3, the wafer is etched to form a plurality of channels in the wafer, such that the protection layer is exposed through the channels. Thereafter in step S4, the protection layer is etched to form a plurality of openings aligned with the channels, such that a plurality of landing pads in the protection layer are respectively exposed through the openings and the channels, and the caliber of each of the openings is gradually increased in a direction toward the corresponding channel. Finally in step S5, a plurality of side surfaces of the wafer surrounding the channels are etched, such that the channels are expanded to respectively form a plurality of hollow regions. The caliber of each of the hollow regions is gradually decreased in a direction toward the corresponding opening, and the caliber of each of the openings is smaller than the caliber of the corresponding hollow region.

In the following description, the aforesaid steps of the manufacturing method of the semiconductor structure will be described. Since the chip 110 shown in FIG. 1 is formed from a wafer after a die preparation process is performed with respect to the wafer, a wafer 110a which is not cut yet to form plural chips 110 is shown in the following description.

Figure 4:
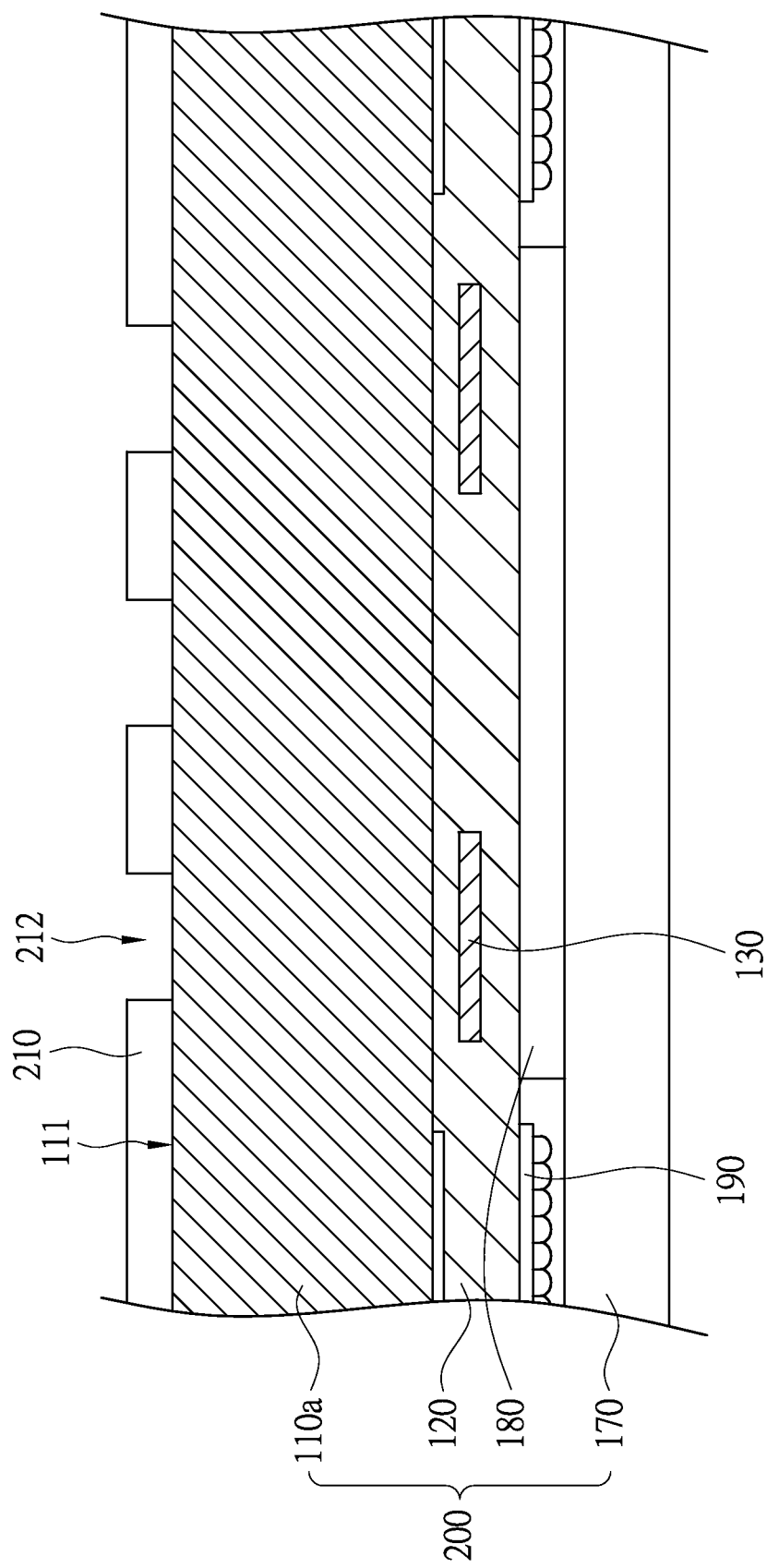
FIG. 4 is a cross-sectional view of a photoresist layer shown in FIG. 3 when being formed on a surface of a wafer.

FIG. 4 is a cross-sectional view of a photoresist layer 210 shown in FIG. 3 when being formed on the surface 111 of the wafer 110a. A wafer structure 200 shown in FIG. 4 is provided, and the wafer structure 200 has the wafer 110a and a protection layer 120 covering the wafer 110. Thereafter, the photoresist layer 210 may be formed on the surface 111 of the wafer 110a facing away from the protection layer 120. Subsequently, the photoresist layer 210 is patterned to form plural openings 212 that are respectively aligned with plural landing pads 130.

Figure 5:
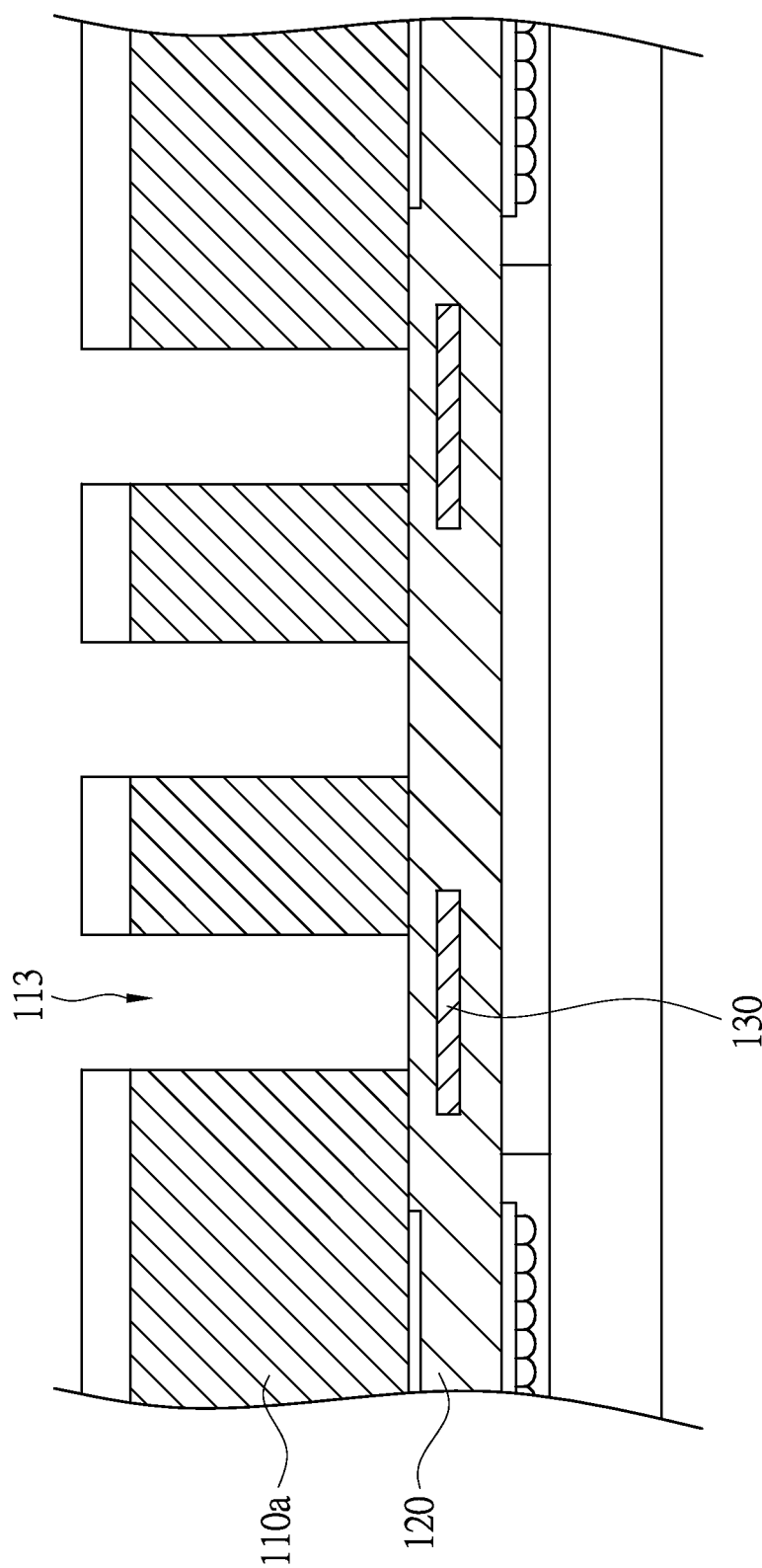
FIG. 5 is a cross-sectional view of the wafer shown in FIG. 4 after being etched.

FIG. 5 is a cross-sectional view of the wafer 110a shown in FIG. 4 after being etched. As shown in FIG. 4 and FIG. 5, after the patterned photoresist layer 210 is formed on the surface 111 of the wafer 110a, the wafer 110a not covered by the photoresist layer 210 may be etched. As a result, a plurality of channels 113 respectively aligned with the landing pads 130 may be formed in the wafer 110a, such that a protection layer 120 above the landing pads 130 may be exposed through the channels 113.

Figure 6:
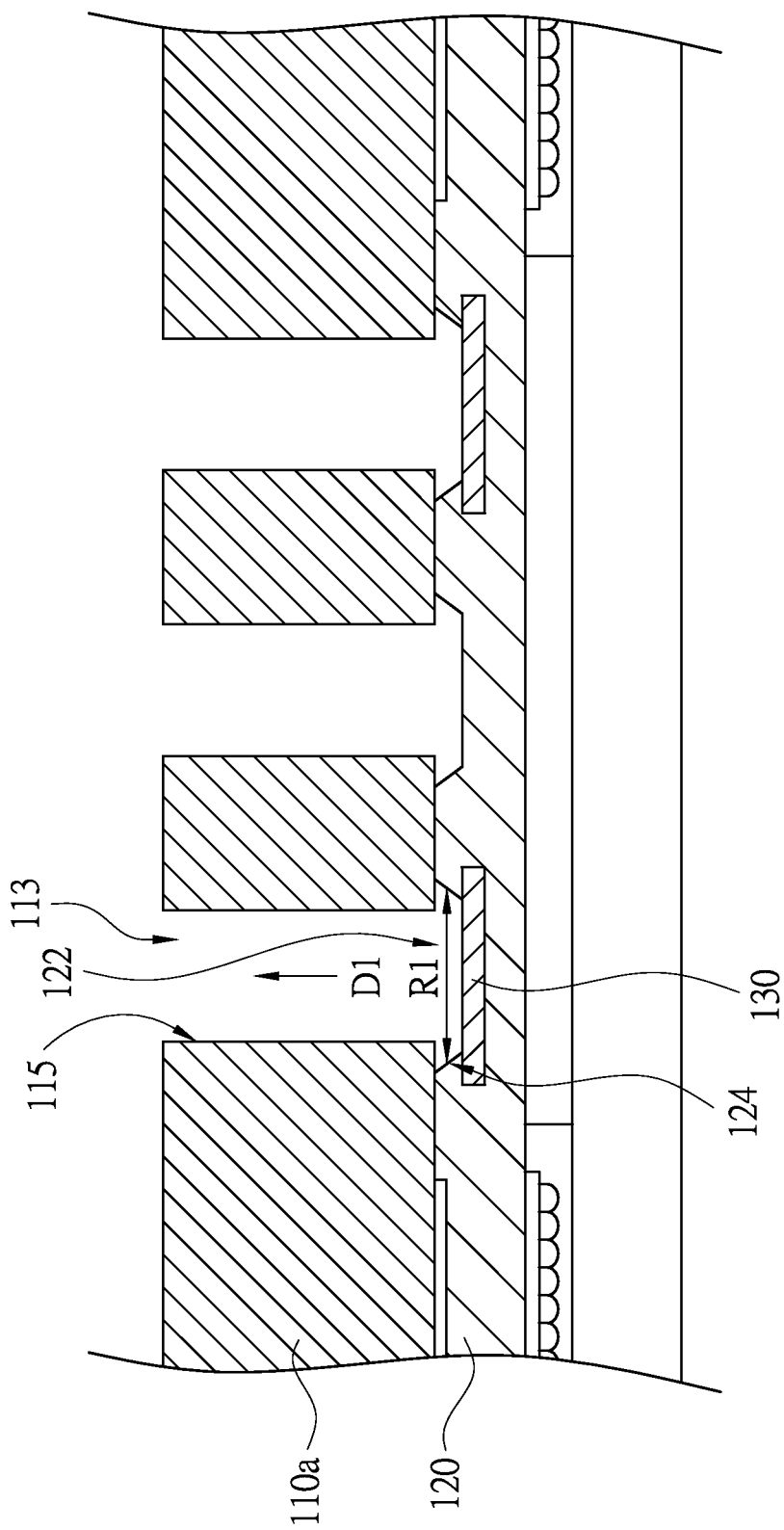
FIG. 6 is a cross-sectional view of a protection layer shown in FIG. 5 after being etched.

FIG. 6 is a cross-sectional view of the protection layer 120 shown in FIG. 5 after being etched. As shown in FIG. 5 and FIG. 6, after the wafer 110a forms the channels 113, the photoresist layer 210 is removed. Thereafter, the protection layer 120 may be etched to form a plurality of openings 122 respectively aligned with the channels 113. During the etching process, the protection layer 120 is laterally etched, such that the landing pads 130 in the protection layer 120 are respectively exposed through the openings 122 and the channels 113, and the caliber R1 of each of the openings 122 is gradually increased in a direction D1 toward the corresponding channel 113. As a result, the first sidewalls 124 are oblique surfaces.

Figure 7:
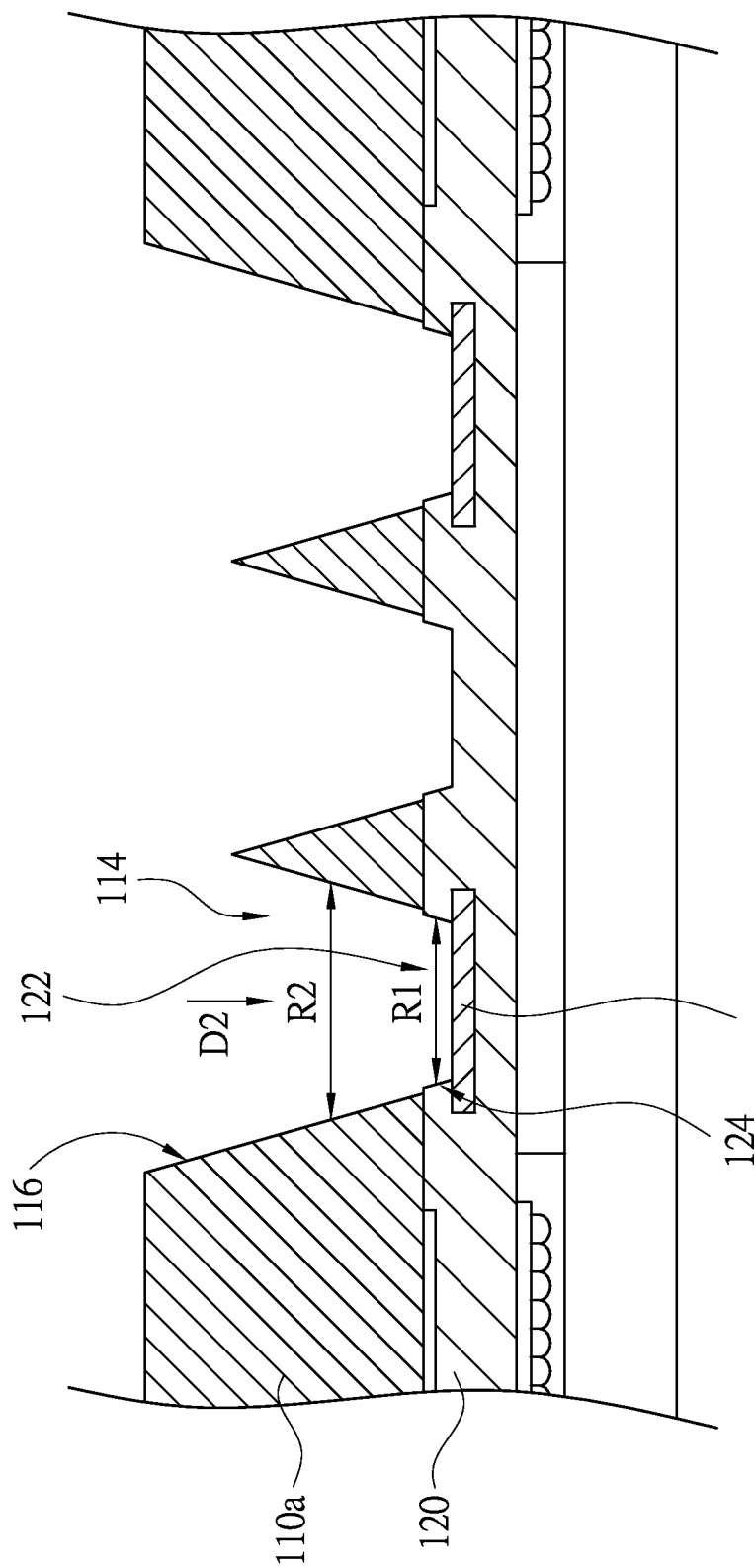
FIG. 7 is a cross-sectional view of the side surfaces of the wafer shown in FIG. 6 after being etched.

FIG. 7 is a cross-sectional view of the side surfaces 115 of the wafer 110a shown in FIG. 6 after being etched. As shown in FIG. 6 and FIG. 7, after the protection layer 120 is etched, the side surfaces 115 of the wafer 110a surrounding the channels 113 may be etched, such that the channels 113 are expanded to respectively form a plurality of hollow regions 114. The caliber R2 of each of the hollow regions 114 is gradually decreased in a direction D2 toward the corresponding opening 122. As a result, plural second sidewalls 116 are oblique surfaces. Moreover, the caliber R1 of each of the openings 122 is smaller than the caliber R2 of the corresponding hollow region 114.

Figure 8:
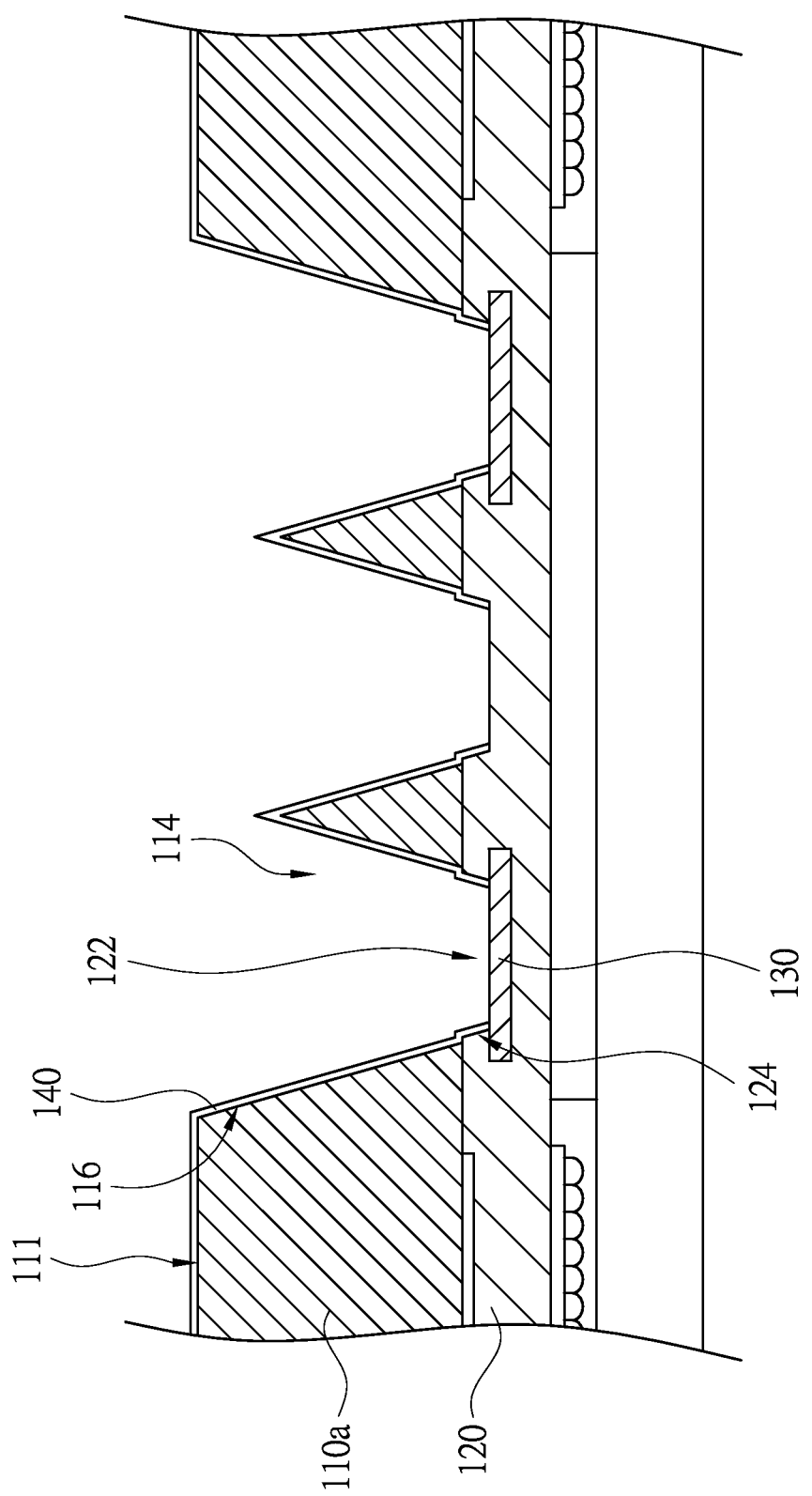
FIG. 8 is a cross-sectional view of first and second sidewalls, and the surfaces of the protection layer adjacent to the first and second sidewalls shown in FIG. 7 after an isolation layer is formed.

FIG. 8 is a cross-sectional view of first and second sidewalls 124, 116, and the surfaces 121 (see FIG. 2) of the protection layer 120 adjacent to the first and second sidewalls 124, 116 shown in FIG. 7 after an isolation layer 140 is formed. As shown in FIG. 7 and FIG. 8, after the hollow regions 114 of the wafer 110a are formed, an isolation layer 140 may be formed on the surface 111 and the second sidewalls 116 of the wafer 110a, the surfaces 121 of the protection layer 120 adjacent to the first and second sidewalls 124, 116, the first sidewalls 124 of the protection layer 120, and the landing pads 130. Thereafter, the isolation layer 140 may be patterned to remove the isolation layer 140 located on the landing pads 130. As a result, a structure shown in FIG. 8 is obtained.

Figure 9:
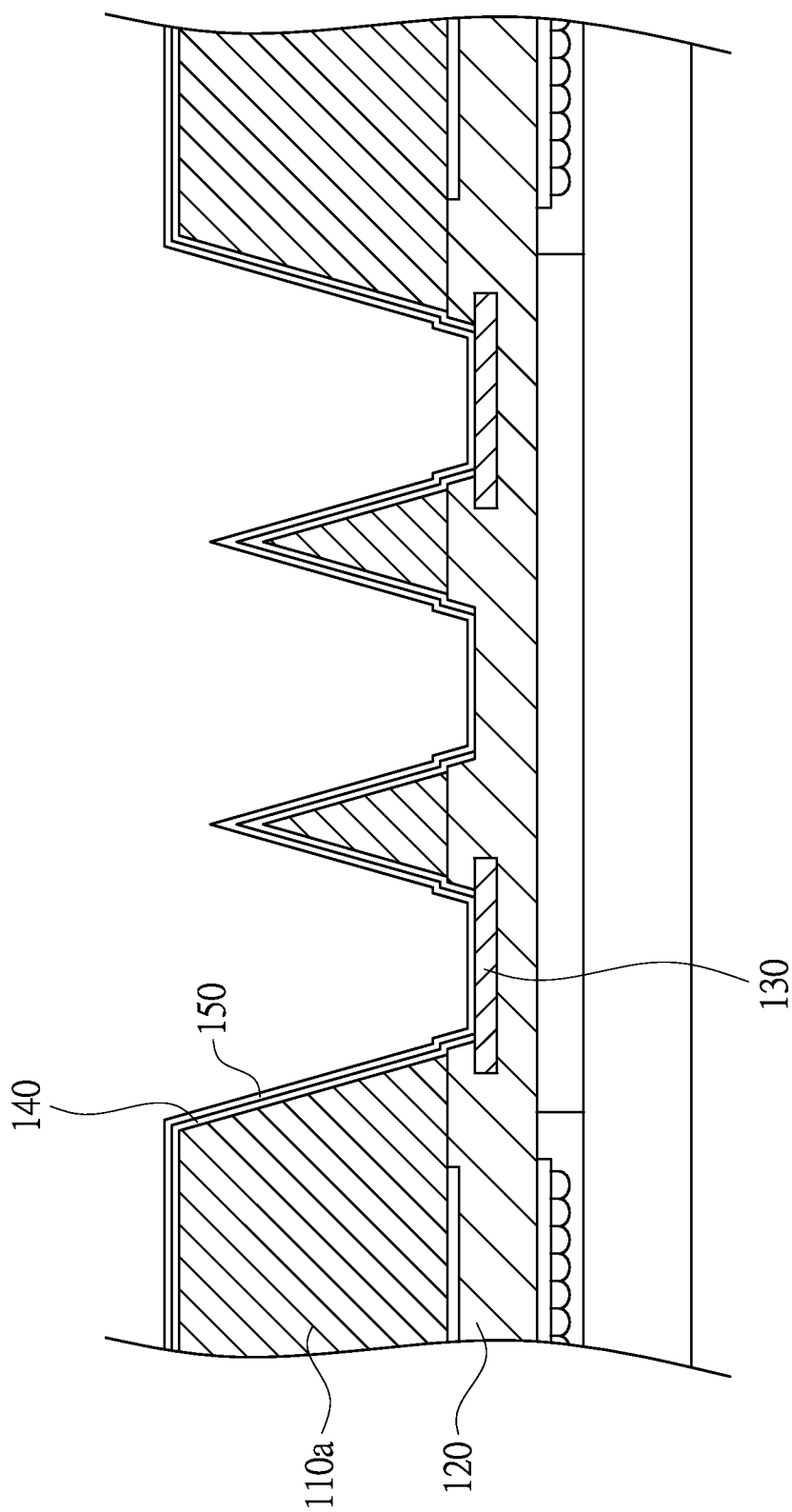
FIG. 9 is a cross-sectional view of the isolation layer and landing pads shown in FIG. 8 after a conductive layer is formed.

FIG. 9 is a cross-sectional view of the isolation layer 140 and the landing pads 130 shown in FIG. 8 after a conductive layer 150 is formed. As shown in FIG. 8 and FIG. 9, after the isolation layer 140 is patterned, the conductive layer 150 may be formed on the isolation layer 140 and the landing pads 130, such that the conductive layer 150 is in electrical contact with the landing pads 130.

Figure 10:
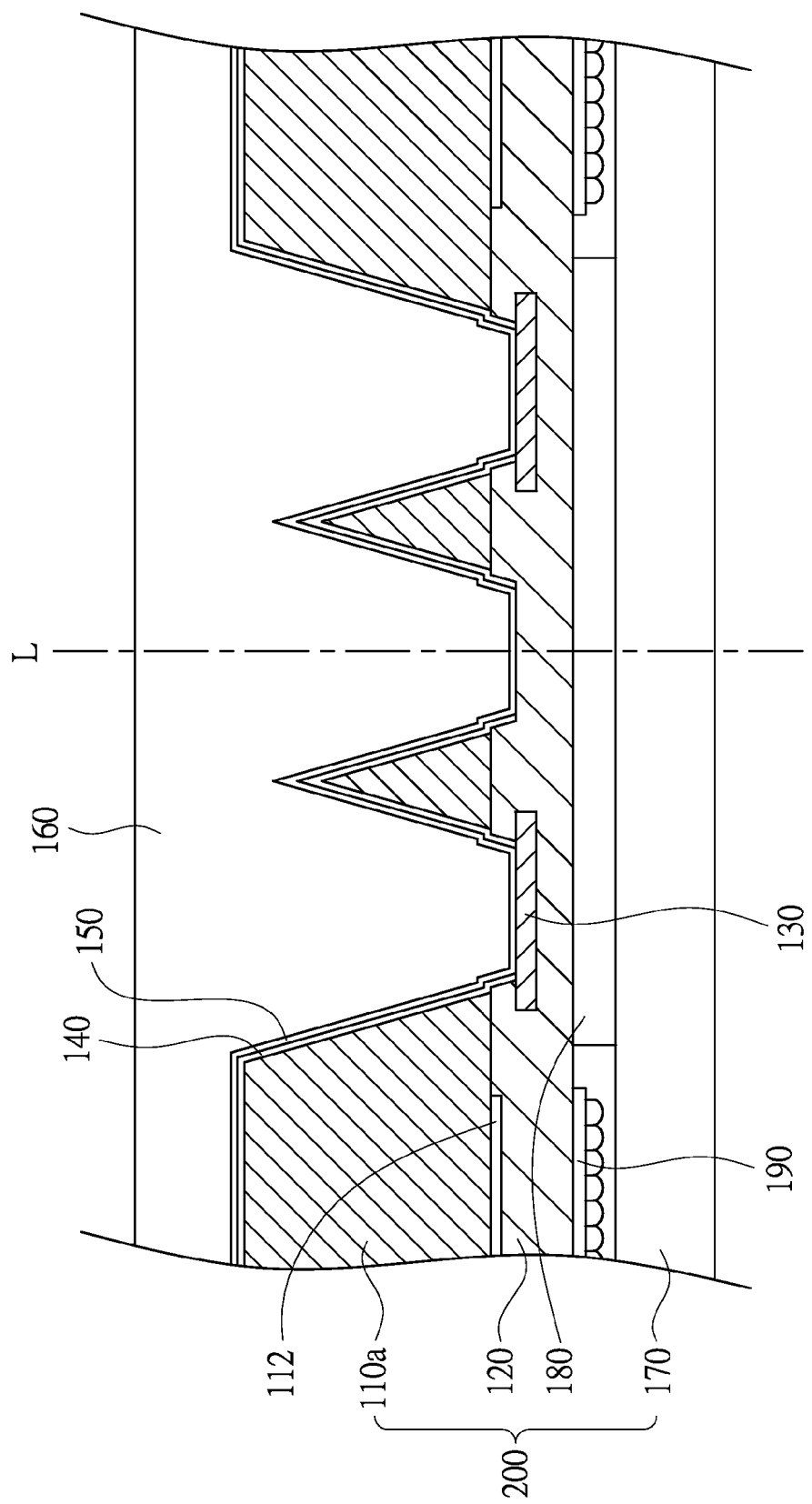
FIG. 10 is a cross-sectional view of the conductive layer shown in FIG. 9 after being covered by a passivation layer.

FIG. 10 is a cross-sectional view of the conductive layer 150 shown in FIG. 9 after being covered by a passivation layer 160. As shown in FIG. 9 and FIG. 10, after the conductive layer 150 is formed on the isolation layer 140 and the landing pads 130, the passivation layer 160 may be covered on the conductive layer 150 for protecting of the conductive layer 150, the wafer 110a, and the landing pads 130. The wafer structure 200 further has a light transmissive element 170 and a supporting layer 180 that is between the light transmissive element 170 and the protection layer 120. Subsequently, a die preparation process may be used to dice the passivation layer 160, the wafer 110a, the protection layer 120, the supporting layer 180, and the light transmissive element 170 along line L, such that the wafer 110a are diced to form the chip 110 (see FIG. 1). As a result, the semiconductor structure 100 shown in FIG. 1 can be obtained.

Figure 11A:
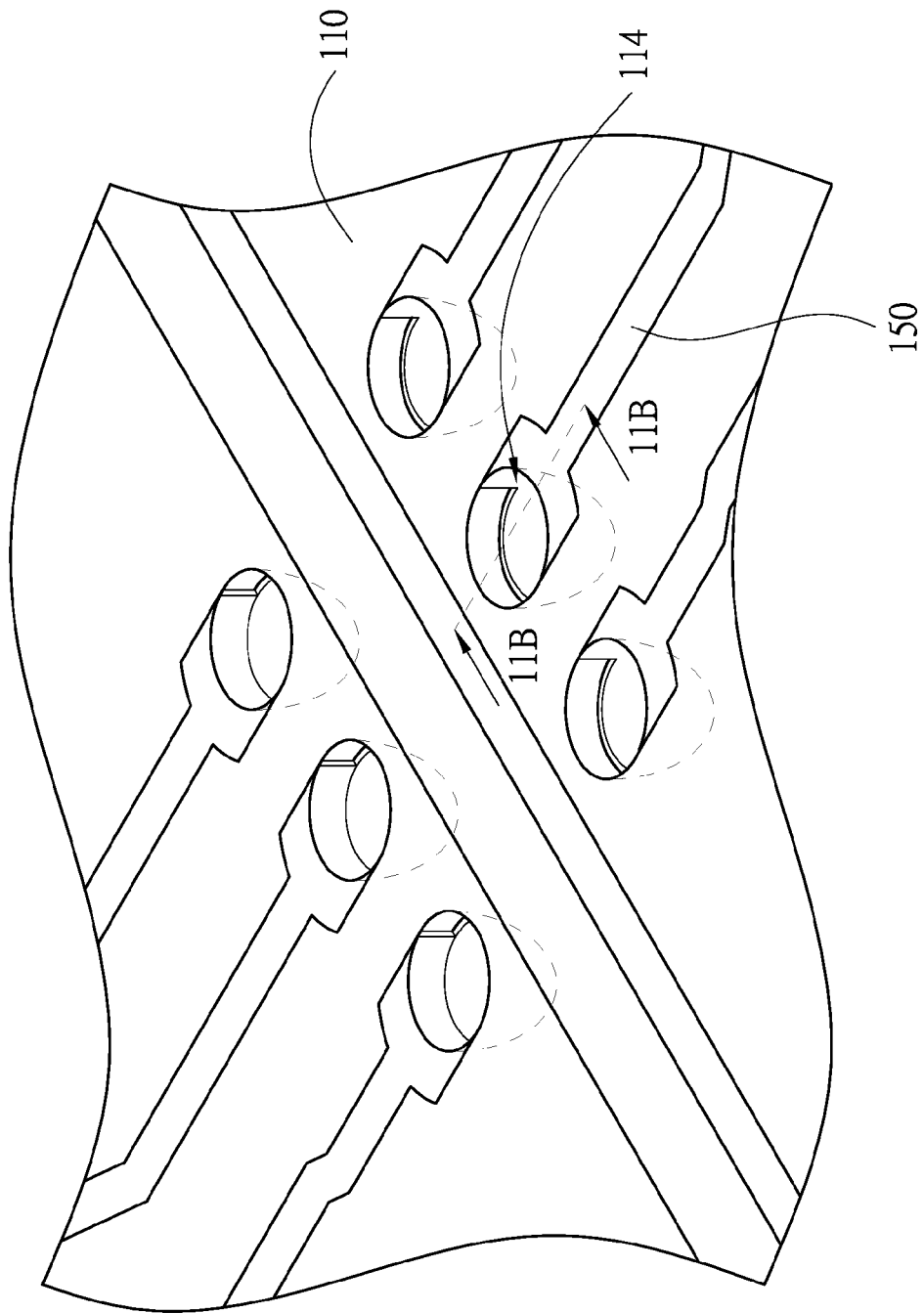
FIG. 11A is a perspective view of a semiconductor structure according to one embodiment of the present invention.
Figure 11B:
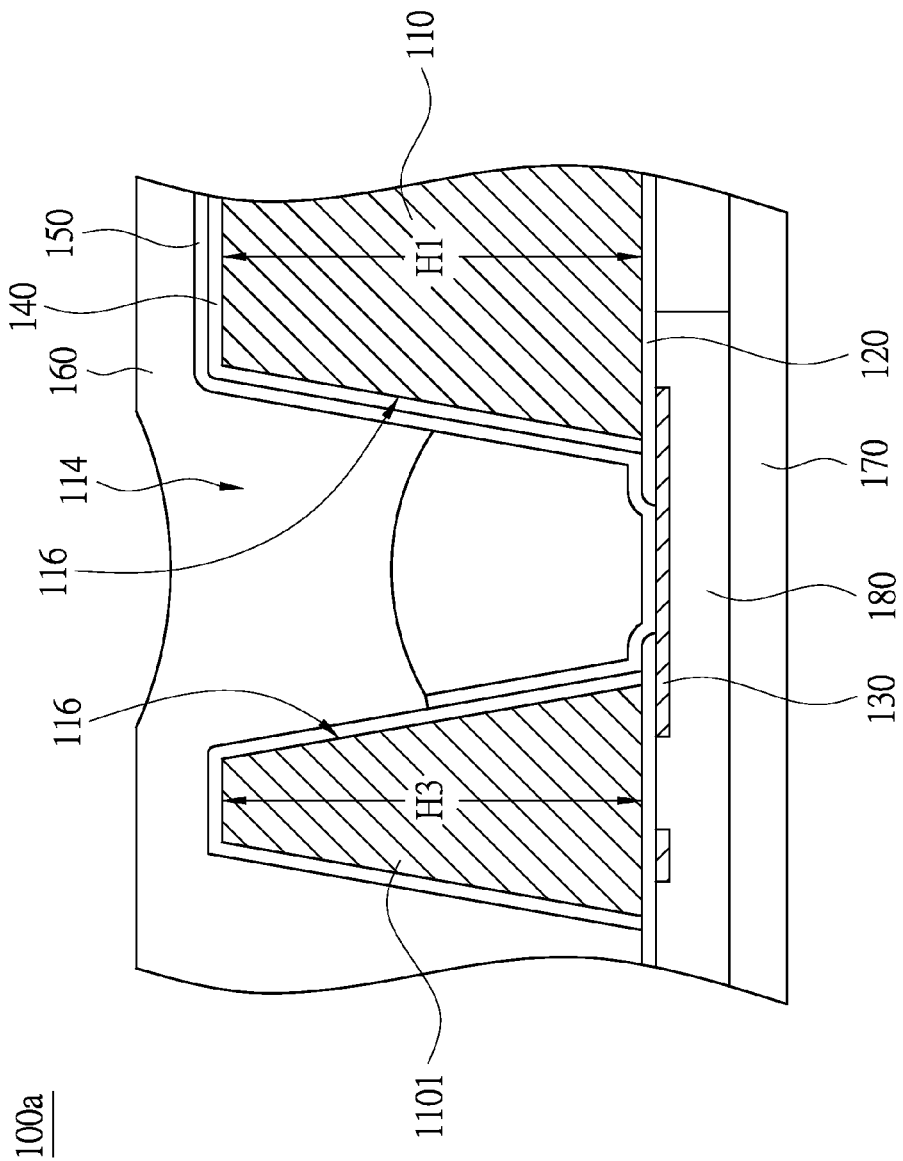
FIG. 11B is a cross-sectional view taken along line 11B-11B shown in FIG. 11A.

FIG. 11A is a perspective view of a semiconductor structure 100a according to one embodiment of the present invention. FIG. 11B is a cross-sectional view taken along line 11B-11B shown in FIG. 11A. As shown in FIG. 11A and FIG. 11B, the semiconductor structure 100a includes the chip 110, the protection layer 120, the landing pad 130, the isolation layer 140, and the conductive layer 150. In this embodiment, the heights of the second sidewall 116 of the chip 110 surrounding the hollow region 114 are substantially the same. That is to say, the thickness H1 of the chip 110 adjacent to the right side of the hollow region 114 is equal to the height H3 of the protruding structure 1101 adjacent to the left side of the hollow region 114. The passivation layer 160 is only disposed in a portion of the hollow region 114, such that a space is formed between the passivation layer 160 and the conductive layer 150 that is on the landing pad 130. Moreover, the shape of the protruding structure 1101 is trapezoid.

Figure 12A:
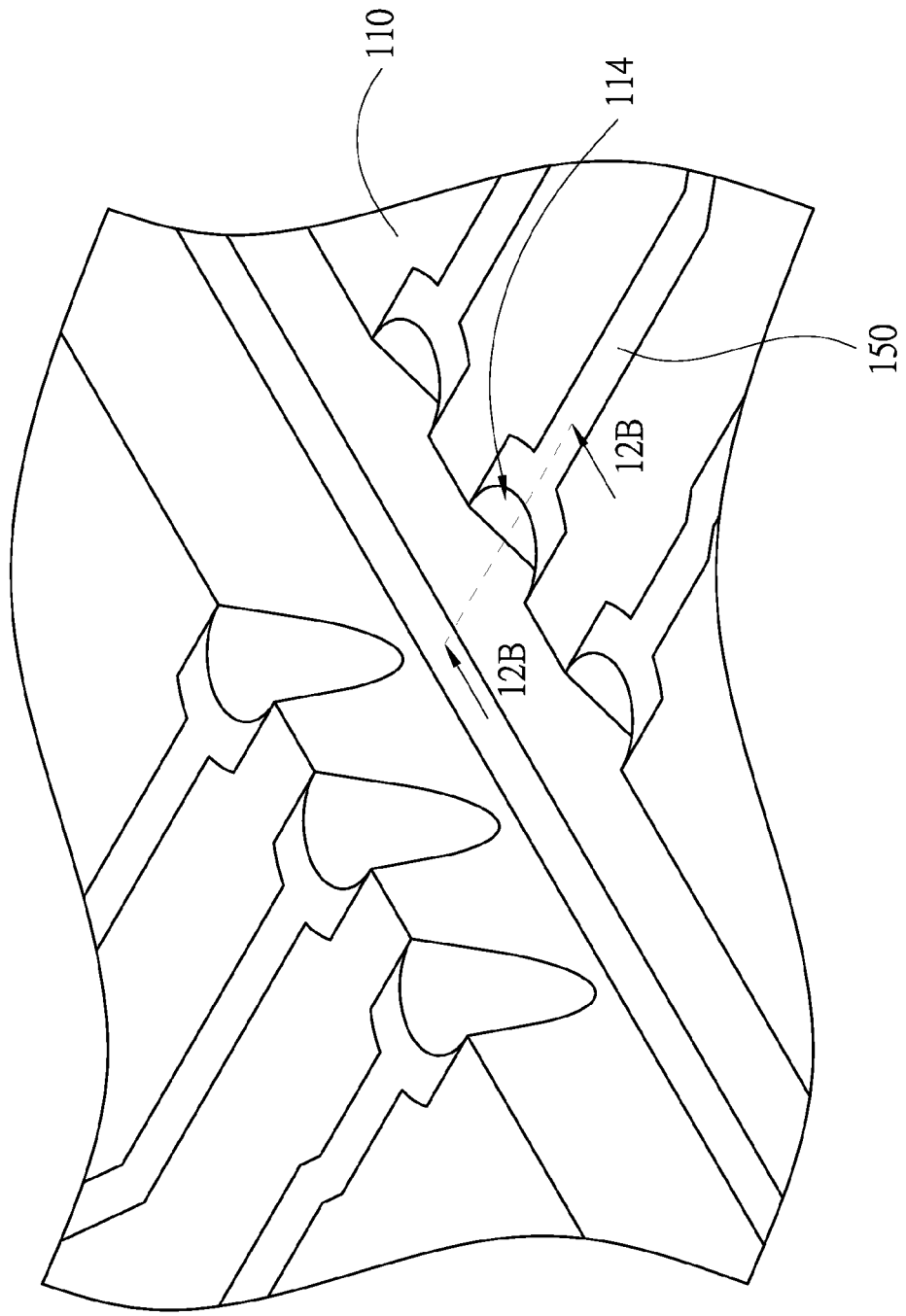
FIG. 12A is a perspective view of a semiconductor structure according to one embodiment of the present invention.
Figure 12B:
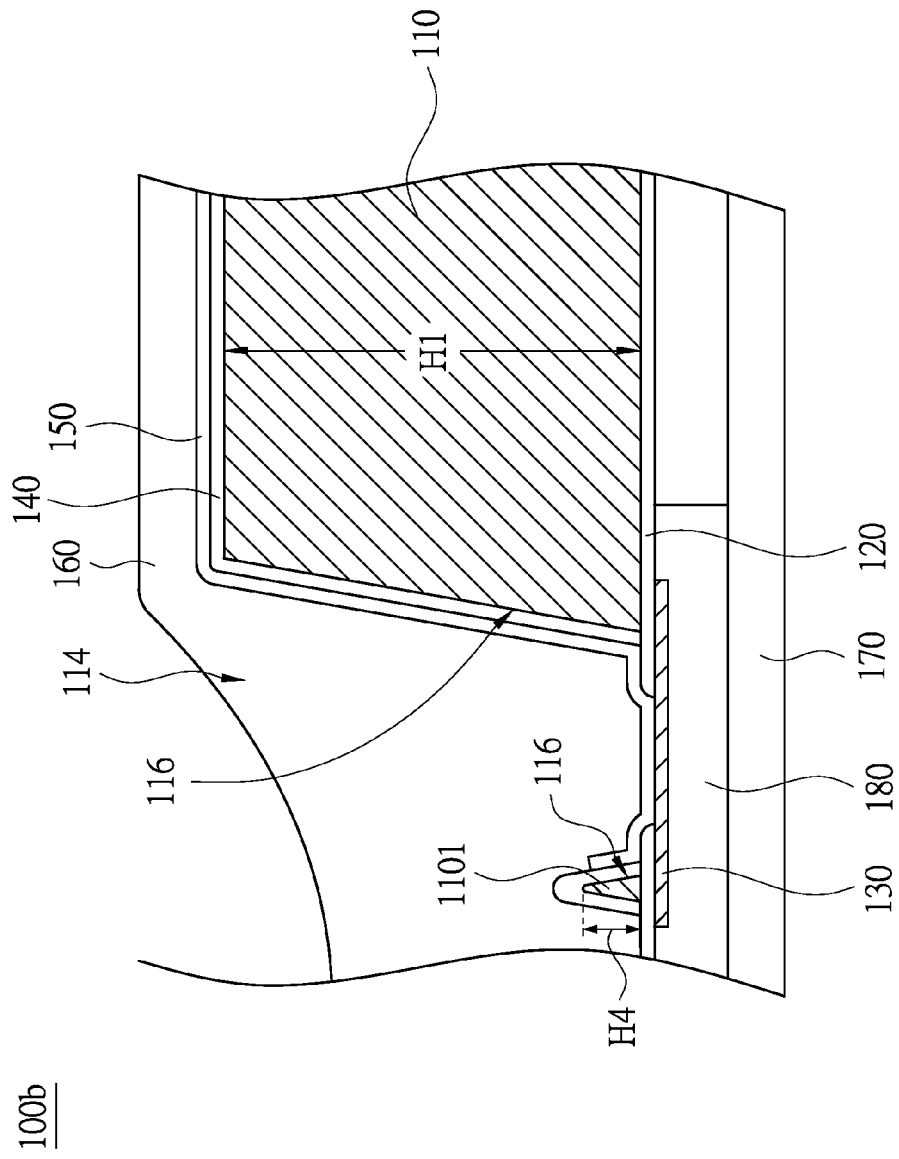
FIG. 12B is a cross-sectional view taken along line 12B-12B shown in FIG. 12A.

FIG. 12A is a perspective view of a semiconductor structure 100b according to one embodiment of the present invention. FIG. 12B is a cross-sectional view taken along line 12B-12B shown in FIG. 12A. As shown in FIG. 12A and FIG. 12B, the semiconductor structure 100b includes the chip 110, the protection layer 120, the landing pad 130, the isolation layer 140, and the conductive layer 150. In this embodiment, the heights of the sidewalls of the chip 110 surrounding the hollow region 114 are different. For example, the second sidewall 116 of the chip 110 at the right side of the hollow region 114 is higher than the second sidewall 116 of the chip 110 at the left side of the hollow region 114. The passivation layer 160 completely covers the conductive layer 150.

As shown in FIG. 12B, the shape of the protruding structure 1101 is triangle. The thickness H1 of the chip 110 adjacent to the right side of the hollow region 114 is greater than the height H4 of the protruding structure 1101 adjacent to the left side of the hollow region 114. In this embodiment, the passivation layer 160 completely covers the hollow region 114.

Figure 13A:
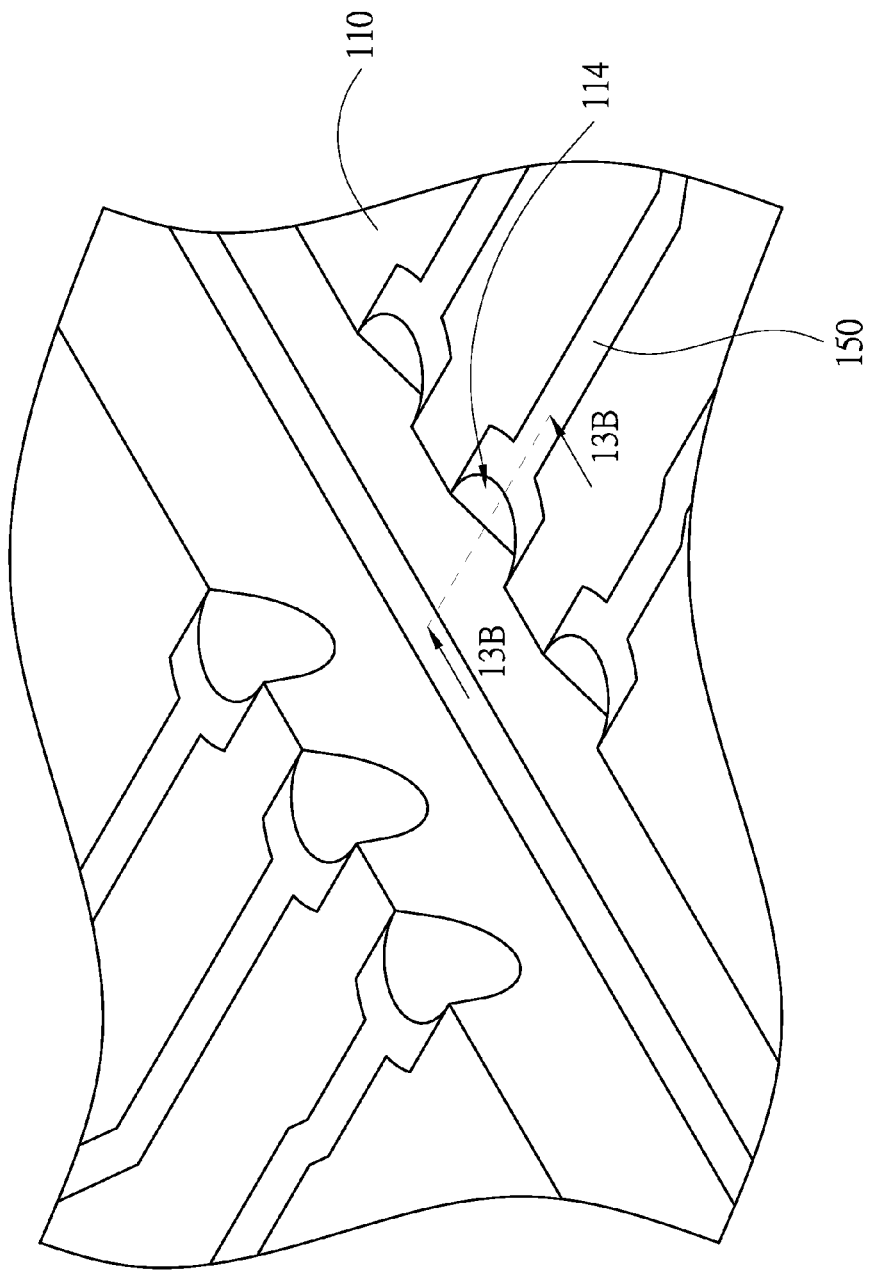
FIG. 13A is a perspective view of a semiconductor structure according to one embodiment of the present invention.
Figure 13B:
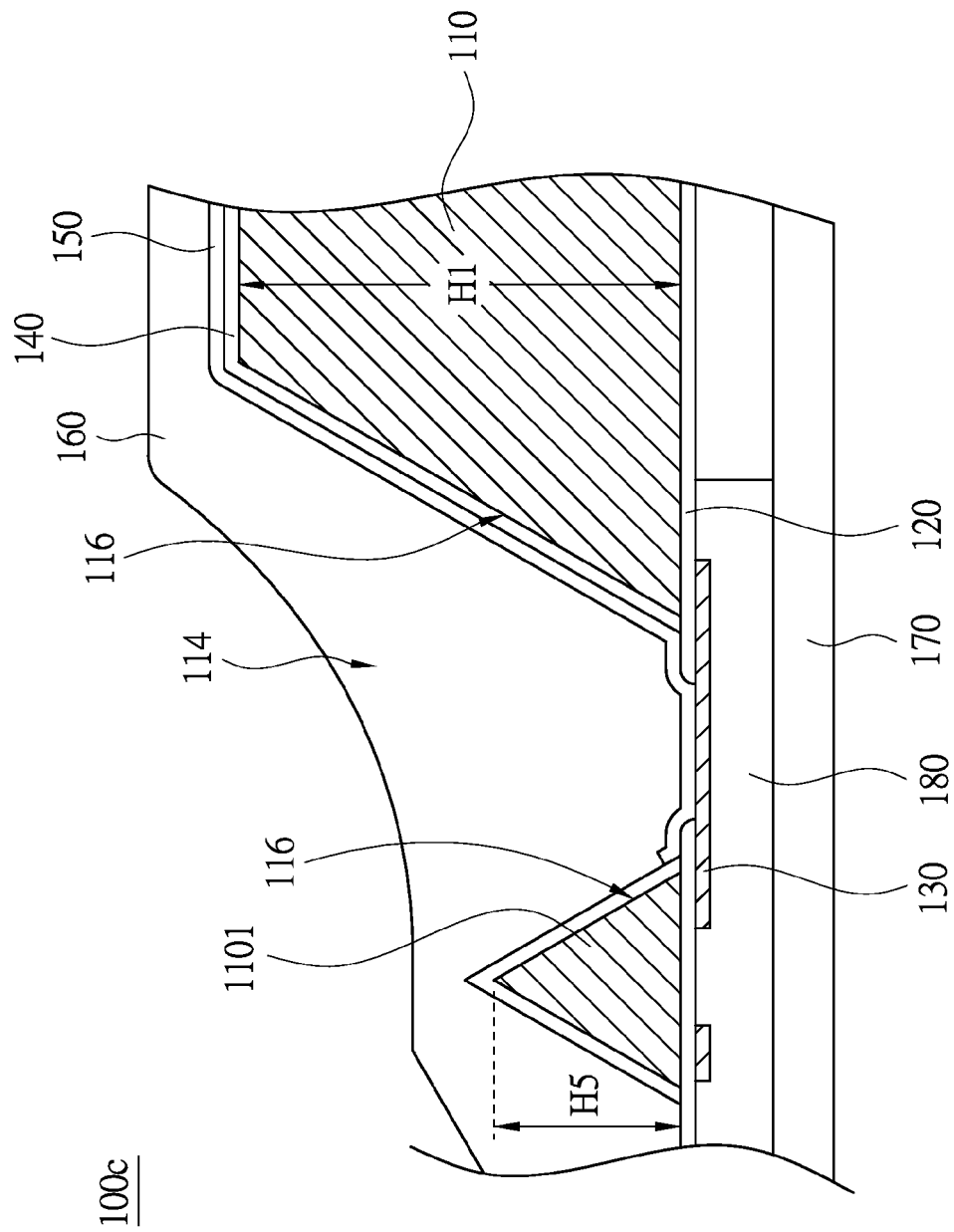
FIG. 13B is a cross-sectional view taken along line 13B-13B shown in FIG. 13A.

FIG. 13A is a perspective view of a semiconductor structure 100c according to one embodiment of the present invention. FIG. 13B is a cross-sectional view taken along line 13B-13B shown in FIG. 13A. As shown in FIG. 13A and FIG. 13B, the semiconductor structure 100c includes the chip 110, the protection layer 120, the landing pad 130, the isolation layer 140, and the conductive layer 150. In this embodiment, the inclinations of the sidewalls of the chip 110 surrounding the hollow region 114 are greater than that shown in FIG. 12B.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure comprising:
a chip having a sensor and a hollow region;
a protection layer located on a surface of the chip and covering the sensor, wherein the protection layer has an opening aligned with and communicated with the hollow region; a caliber of the opening is smaller than a caliber of the hollow region; the caliber of the opening is gradually increased in a direction toward the hollow region, and the caliber of the hollow region is gradually decreased in a direction toward the opening, such that a first sidewall of the protection layer surrounding the opening and a second sidewall of the chip surrounding the hollow region are oblique surfaces;
a landing pad located in the protection layer and exposed through the opening;
an isolation layer located on the first and second sidewalls and a surface of the protection layer adjacent to the first and second sidewalls not covering the landing pad; and
a conductive layer located on the isolation layer and covering the landing pad, wherein the conductive layer is in electrical contact with the landing pad.

2. The semiconductor structure of claim 1, wherein an included angle between the first sidewall and the landing pad and an included angle between the second sidewall and the protection layer are acute angles.

3. The semiconductor structure of claim 1, further comprising:
a passivation layer covering the conductive layer.

4. The semiconductor structure of claim 3, heights of the second sidewall of the chip surrounding the hollow region are the same, and the passivation layer is disposed in a portion of the hollow region.

5. The semiconductor structure of claim 3, the second sidewall of the chip at a side of the hollow region is higher than the sidewall of the chip at another side of the hollow region, and the passivation layer completely covers the hollow region.

6. The semiconductor structure of claim 1, further comprising:
a light transmissive element; and
a supporting layer between the light transmissive element and the protection layer, wherein a space is formed among the light transmissive element, the supporting layer, and the protection layer.

7. The semiconductor structure of claim 6, further comprising:
a color filter disposed on a surface of the protection layer facing away from the chip, and located in the space, wherein the color filter is aligned with the sensor.

8. The semiconductor structure of claim 1, wherein the chip has a protruding structure adjacent to a side of the hollow region.

9. The semiconductor structure of claim 8, a shape of the protruding structure is triangle.

10. The semiconductor structure of claim 8, a shape of the protruding structure is trapezoid.

11. The semiconductor structure of claim 8, a thickness of the chip adjacent to another side of the hollow region is equal to a height of the protruding structure.

12. The semiconductor structure of claim 8, a thickness of the chip adjacent to another side of the hollow region is greater than a height of the protruding structure.

13. The semiconductor structure of claim 1, wherein the sensor is an image sensor.

\* \* \* \* \*